United States Patent

[11] 3,612,961

[72] Inventors Keiichi Shimakura; Hirohiko Yamamoto; Masamichi Shiraishi, all of Tokyo, Japan

[21] Appl. No. 839,273
[22] Filed July 7, 1969
[45] Patented Oct. 12, 1971
[73] Assignee Nippon Electric Company Limited Tokyo, Japan
[32] Priority July 6, 1968
[33] Japan
[31] 43-47302

[54] SEMICONDUCTOR INTEGRATED CIRCUIT DEVICE
3 Claims, 8 Drawing Figs.

[52] U.S. Cl. .......... 317/235 R, 317/235 G, 317/235 AH
[51] Int. Cl. .......... H01l 19/00
[50] Field of Search .......... 317/235 B, 235 G, 235 AG

[56] References Cited

UNITED STATES PATENTS 3,386,016 5/1968 Lindmayer .......... 317/235
3,463,974 8/1969 Kelley et al. .......... 317/235

OTHER REFERENCES

1) *IBM Journal,* "Stabilization of $SiO_2$ Passivation Layers with $P_2O_5$" by Kevv et al., Sept. 1964 pages 376–384.
2) *Applied Physics Letters* "$Al_2O_3$—Silicon Insulated Gate Field Effect Transistors" by Waxman et al., 1 Feb. 1968 pages 109, 110.

*Primary Examiner*—Jerry D. Craig
*Attorney*—Sandoe, Hopgood & Calimafde

ABSTRACT: An integrated circuit device in which a semiconductor substrate contains a plurality of active or passive elements with an insulation layer interposed between the substrate and a metallic layer for wiring connections. The insulation at gate regions comprises phosphorous coated silicon oxide or an aluminum oxide or other suitable materials to stabilize the elements at a desired relatively low threshold voltage. The insulation at regions between the elements comprises silicon oxide (without a phosphorus coating) or a silicon nitride or other suitable material which provides a relatively high threshold voltage and high surface density in order to prevent the formation of conducting channels between the elements.

INVENTORS
KEIICHI SHIMAKURA
HIROHIKO YAMAMOTO
MASAMICHI SHIRAISHI
BY Sandoe, Hopgood and Calimafde
ATTORNEY INVENTORS
KEIICHI SHIMAKURA
HIROHIKO YAMAMOTO
MASAMICHI SHIRAISHI
BY
Sandoe, Hopgood and Calimafde
ATTORNEYS

INVENTORS

KEIICHI SHIMAKURA
HIROHIKO YAMAMOTO
MASAMICHI SHIRAISHI

BY

Sandoe, Hopgood and Calimafde
ATTORNEY

INVENTORS
KEIICHI SHIMAKURA
HIROHIKO YAMAMOTO
MASAMICHI SHIRAISHI
BY
Sandoe, Hopgood and Calimafde
ATTORNEYS

SEMICONDUCTOR INTEGRATED CIRCUIT DEVICE

This invention relates to an improved semiconductor integrated circuit device.

BACKGROUND OF THE INVENTION

As presently known, the monolithic integrated circuit is composed of active or passive elements that are incorporated into a semiconductor substrate with wiring for those elements being made by a metallic layer formed on the substrate with interposed insulation layers, whereby various electronic circuits are realized. However, in monolithic semiconductor circuits, parasitic effects due to parasitic elements may be produced because the elements are incorporated into a common substrate. To avoid such parasitic effects individual elements are electrically isolated from each other and are provided with wirings for necessary operations. However, where a wiring handles a high voltage an excessive leakage current may flow on the surface of the insulation film located between the elements which must be kept isolated from each other, thus causing imperfect operation. This phenomenon is caused because the metallic wiring layer to which the high voltage is applied is located above the insulation film and therefore an inversion layer is induced on the surface of the semiconductor substrate located immediately below the metallic wiring layer. This may be due to the electric field or to the later-mentioned "edge effect" on the surface of the substrate which is near the wiring layer. In any event a conduction channel is produced between the elements causing an excessive leakage current.

OBJECT OF THE INVENTION

It is an object of this invention to provide a semiconductor integrated circuit having a structure by which the occurrence of excessive leakage current due to parasitic effects can be prevented.

SUMMARY OF THE INVENTION

According to this invention, the $N_{FB}$ (the surface state density per unit area of the insulation film in contact with the semiconductor) of part or of the whole of the insulation film between the elements is increased in order to prevent the formation of conductive channel caused by surface inversion induced by the field on the surface of the semiconductor located immediately below the wiring metallic layer or by the "edge effect;" whereby the threshold voltage (i.e., the voltage at which the formation of the channel begins) of said part of the insulation film is raised above the voltage applied to he wiring, and the production of the inversion layer is thus prevented and excessive leakage current is eliminated.

Generally, in a semiconductor integrated circuit, it is necessary for the $N_{FB}$ of the insulation film above the element to be decreased so as to improve the characteristics of the element. For example, in the production of the semiconductor integrated circuit using a silicon oxide film as an insulation film, a phosphorus treatment is usually applied to the silicon oxide film on the whole surface of the pellet in a known manner, and thus the $N_{FB}$ is decreased. Therefore, to partially increase the $N_{FB}$ of the silicon oxide film, it is necessary to partially remove the surface layer to which the phosphorus treatment is applied.

According to this invention, a semiconductor integrated circuit which permits a high voltage application thereto can be realized and accordingly the switching characteristic of the circuit as well as the amplifying characteristic can be remarkably improved.

BRIEF DESCRIPTION OF THE DRAWINGS

The invention will be explained by referring to the appended drawings. In the drawings:

FIG. 1 is a plan view showing a MOS integrated circuit based on a p-channel MOS (metal-silicon oxide film-semiconductor) transistor, and FIG. 2 is a sectional view of FIG. 1. This example circuit is an inverter circuit in which a main transistor 3, load transistor 2 and a protective diode 10 for said main transistor are formed in an N-type semiconductor substrate 1 by a conventional planar technique, and these elements are wired by metallic layers 6, 7, 8 and 9. A power source terminal 6′ is disposed so that power is supplied to a drain layer 11 of the main transistor 3 via the load transistor 2. In order to protect the silicon oxide film from damage an input terminal 7′ is provided with a protective diode 10 in which a P-type diffusion layer is disposed. A ground terminal 8′ is connected to a source diffusion layer 12 of the main transistor 3. Because the individual basic elements which make up the circuit are disposed in a common semiconductor substrate, parasitic MOS elements 4 and 5 are produced respectively between the input terminal 7′ and output terminal 9′ and between the input terminal 7′ and ground terminal 8′. These parasitic elements depend upon a P-type layer 13 of the protective diode 10 as the drain diffusion layer, the output terminal 9′ or ground terminal 8′ as the source electrode, a metallic layer 7 from the input terminal 7′ to main transistor gate 14 as the gate electrode. When a voltage higher than the threshold voltage of the parasitic MOS element is applied to the input terminal 7′, a P-type inversion layer 17 is formed on the surface of the semiconductor between the protective diode diffusion layer 13 and the source diffusion layer 12 of the main transistor 3, and a conductive channel for the parasitic MOS element is formed, whereby an excessive leakage current is produced between the input terminal 7′ and the ground terminal 8′. To prevent causing such excessive leakage current, it is necessary that the threshold voltage of the silicon oxide film 15 be higher than the voltage applied to the input terminal. In this manner, an inversion layer is not formed on the semiconductor surface and thus it becomes possible to prevent the occurrence of said excessive leakage current.

FIGS. 3 and 4 illustrate a semiconductor integrated circuit embodying this invention, which is an example of an improvement on the device of FIGS. 1 and 2. The MOS integrated circuit according to this invention differs from the conventional MOS integrated circuit in that the conventional circuit has a layer 16 of which the entire part above the silicon oxide film 15 receives phosphorus treatment, whereas, according to this invention, part of the phosphorus-treated layer corresponding to the portion 19 is removed, to increase the $N_{FB}$ of the corresponding portion of the silicon oxide film 15′. raise the threshold voltage of the portion, cut off the inversion layer 17, and thus prevent the occurrence of excessive leakage current. By this arrangement, it becomes possible to obtain a semiconductor integrated circuit which permits a high voltage to be applied to the wiring between the elements and thus the switching characteristic as well as the amplifying characteristic of the circuit can be remarkably improved.

In the foregoing MOS integrated circuit, a silicon oxide film may be employed for the entire insulation film of the MIS structure (metal-insulation material-semiconductor) and phosphorus treatment is applied to decease the $N_{FB}$ of the element itself so as to stabilize the characteristics thereof. As a modification of this arrangement, an aluminum oxide film whose $N_{FB}$ is small may be used for the insulation film over the element itself, thereby stabilizing the threshold voltage of the element at a low level, and a silicon oxide film or the like whose $N_{FB}$ is large and to which no phosphorus treatment is applied may be used for the insulation film in which the parasitic MIS element is produced between the elements, thereby raising the threshold voltage of the silicon oxide film whereby excessive leakage current due to the parasitic MIS element can be avoided.

Figure 1:
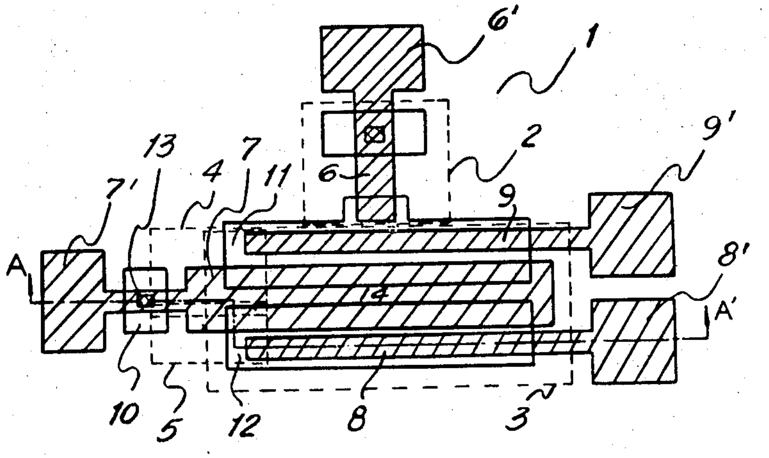
Fig. 1 (PRIOR ART)
FIG. 1 is a plan view showing an example of a known integrated circuit in which an insulated gate type field effect transistor is used as the basic element.
Figure 2:
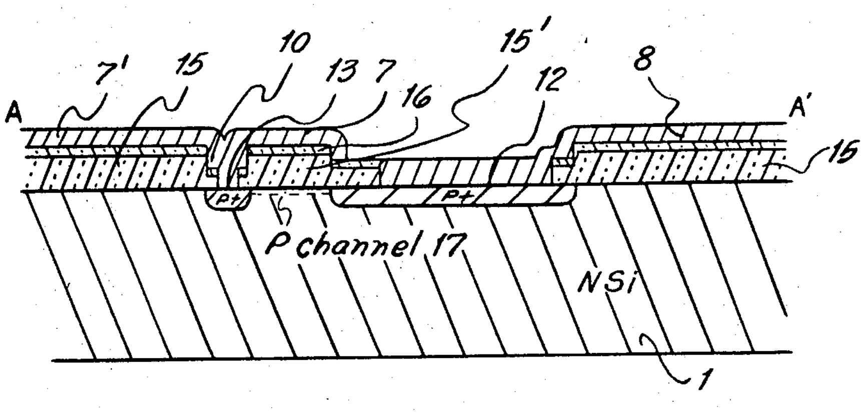
Fig. 2 (PRIOR ART)
FIG. 2 is a sectional view taken across A—A′ in FIG. 1.
Figure 3:
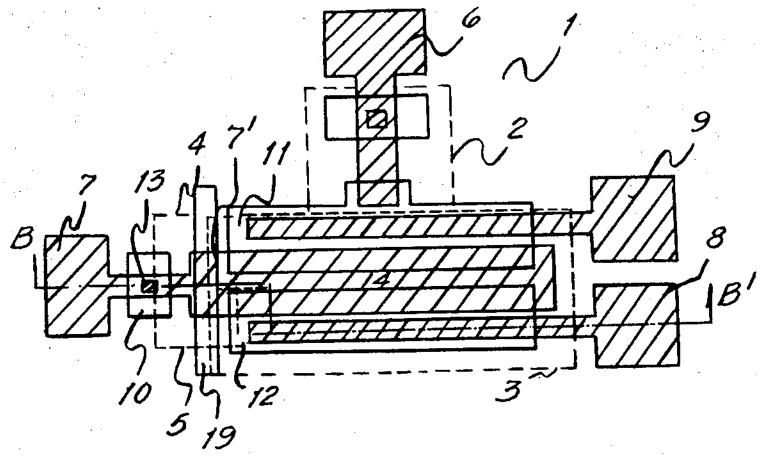
FIG. 3 is a plan view showing an embodiment of improved semiconductor integrated circuits according to this invention.
Figure 4:
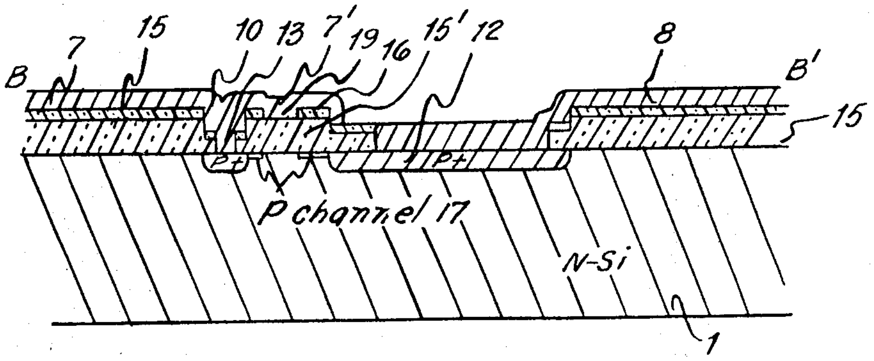
FIG. 4 is a sectional view taken across B—B′ in FIG. 3.
Figure 5:
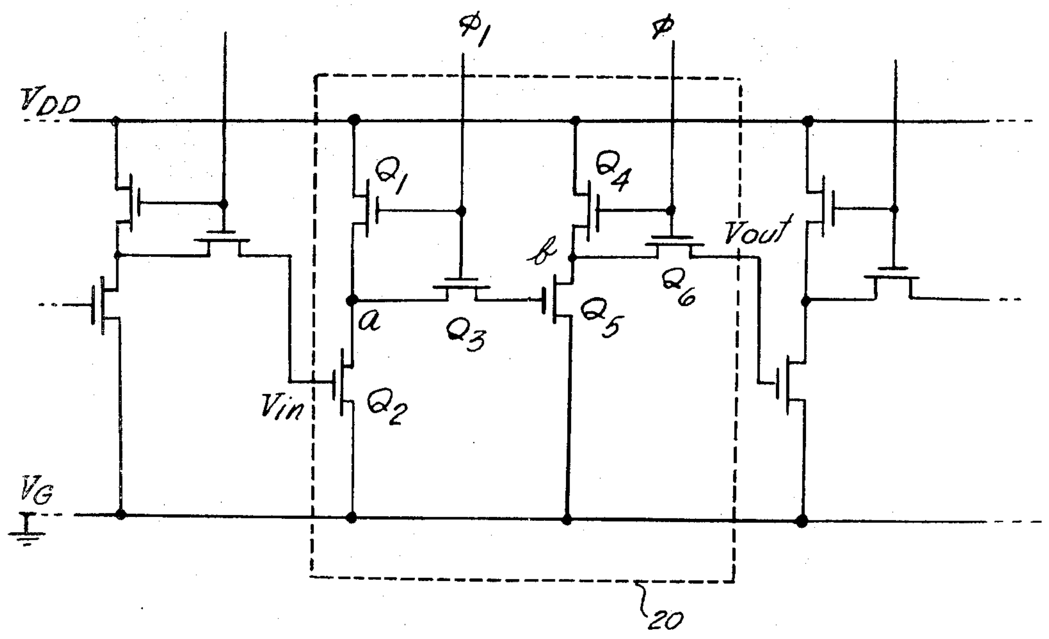
FIG. 5 is a partial circuit diagram of a shift register.
Figure 6:
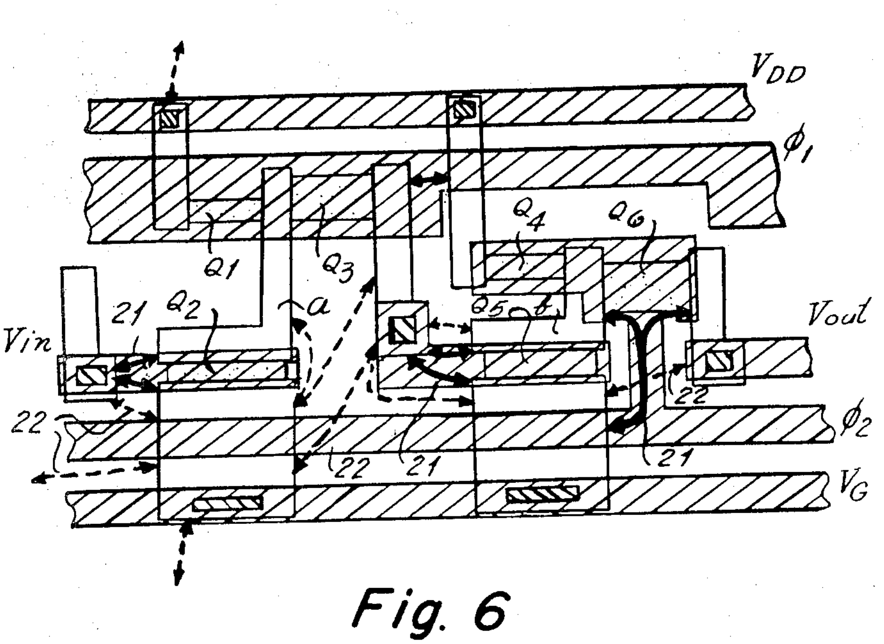
FIG. 6 is a plan view showing an example of a conventional integrated circuit which realizes the circuit of FIG. 5.

Now referring to FIGS. 5 to 7, a second embodiment of this invention will be explained. FIG. 5 is a schematic diagram of a part of a shift register wherein a 1-bit shift register circuit is designated by 20. FIG. 6 shows a layout of the circuit 20 as a conventional integrated circuit. The circuit 20 comprises six MOS transistors $Q_1$ to $Q_6$, and a source voltage $V_{DD}$ (about −28 v.) connected to the main MOS transistors $Q_2$ *and* $Q_5$ through the load MOS transistors $Q_1$ and $Q_4$. An input information comes in the gate of transistor $Q_2$. When the input gate voltage $V_{in}$ is higher than the threshold voltage ($V_{T1}$) of transistor $Q_2$, the transistor $Q_2$ turns on, and the potential at point *a* approaches zero (ground). If the input voltage is below $V_{T1}$, transistor $Q_2$ turns off, and the potential at the point *a* approaches $V_{DD} -_{VT1}(Q_1)$). Here, "high" potential refers to a high of that potential absolute value therefore, that is, the case of a p-channel in which all the elements operate at negative voltages, high potential means a large negative potential. The transistor $Q_3$ is turned on by the first clock voltage $\Phi_1$ applied to the gate of transistor $Q_3$. Thus the information is transmitted to the gate of transistor $Q_5$. In this case, if the potential at the point *a* is high, transistor $Q_5$ turns on, and if it is low, transistor $Q_5$ remains in the off state. In this operation, the potential at the point *b* is zero (ground) when transistor $Q_5$ is on and becomes high when transistor $Q_5$ is off. The information is then sent to the next input stage by the second clock $\Phi_2$ applied to the gate of transistor $Q_6$.

In FIG. 6, the circuit 20 is realized in a minute area of an integrated circuit by a 200 micron formation on an N-type silicon substrate. In detail, P-type impurity-diffused regions are formed in the substrate, and are shown in FIG. 6 as areas without hatch lines or dots. Almost all of the surface of the substrate having P-type regions is covered with a silicon oxide film of about 1.2 microns thick. In order to make MOS transistors, the thickness of predetermined portions of the oxide film is reduced to 0.2 micron, thus forming a gate oxide film which is shown in FIG. 6 by the dotted areas. The entire surface of the oxide film is then subjected to the phosphorus treatment and as a result, a thin layer of phosphorus-glass $(SiO_2{\cdot}P_{2b}{}^{o}{}_{5})$ is formed. This is necessary to reduce the threshold voltage $V_{T1}$ at the gate and to protect the PN junctions between the P-type regions and the substrate or to prevent the occurrence of leakage current at the PN junctions. On the phosphorus-treated oxide film, wirings of aluminum layers are formed, which are shown in FIG. 6 as cross hatched areas. Connections between the wirings and the P-type regions effected through windows opened in the oxide film are shown as double-hatched areas. The MOS transistors $Q_1$ to $Q_6$ and the electrical connections therebetween as shown in FIG. 5 are thus realized. Each MOS transistor comprises a gate oxide film, two P-type regions bridged by the gate oxide film, and an aluminum layer on the gate oxide film, or a gate electrode.

In this circuit, the threshold voltage $V_{T1}$ of each of the MOS transistors $Q_1$ through $Q_6$ is about −3 v. when the gate oxide film is about 0.2 microns thick after phosphorus treatment. The threshold voltage of the other portion of the oxide film is about −25 v. and the film is about 1.2 microns thick.

To make this element operate as it should it is necessary that the N-type silicon surface between the diffused regions not be inverted to P-type If the silicon surface between the diffused regions is inverted and thus produces conducting channel, the independent portions are short-circuited and the functions of the element are lost.

Generally, the threshold voltage of each of the transistors $Q_1$ through $Q_6$ (about −3 v.) is called $V_{T1}$, and the threshold voltage of the other portion (about −25V) is called $V_{T2}$. As already described, a higher magnitude of voltage $V_{T2}$ is preferred. However, the voltage $V_{T2}$ of the usual oxide film obtainable by the usual manufacturing process is only about −20 to −25 v., while it is about −40 to −60 v. if the film is not subjected to phosphorus treatment. Therefore, when a wiring layer for high power voltage is located on the oxide film at the portion between mutually independent diffusion regions, the element will be subject to erroneous operation unless the voltage $V_{T2}$ of the oxide film at that portion is higher than the power source voltage. This is the "parasitic MOS effect." This effect in fact appears in the device of FIG. 6, for example, along the paths shown by the solid arrows 21. Also, where a portion of the wiring layer whose potential is high, such as the power source voltage, is formed over the oxide layer between the diffused regions, an electric charge appears on the thick oxide film between the diffused regions, even though an MOS structure between the diffused regions is not constituted and; as a result, the potential on the surface of the oxide film becomes equal to that of the wiring layer (such as that of the power source). This results in the formation of a channel on the silicon surface between the diffused regions, and the element operates incorrectly. This is called edge effect. In fact, edge effect may occur in the device of FIG. 6, for example, along the paths shown by the dotted arrows 22.

The voltage $V_T$ is given by the following equation:

$$V_T=\left(\frac{Q_{FB}}{\epsilon}+\frac{Q_B}{\epsilon}\right)t$$

where $Q_{FB}$: charge density per unit area of Si–$SiO_2$ boundary surface. (Note: $Q_{FB}$=e$N_{FB}$, where *e* is the charge of an electron)

$Q_B$: charge density per unit area of the depletion layer $\epsilon$: dielectricity of $SiO_2$

*t*: thickness of $SiO_2$

If $Q_B$ is changed greatly, this will affect the value of the threshold voltage $V_{T1}$. However, since $Q_B$ is determined by the specific resistivity of the substrate and since it is difficult to increase the thickness of the film to more than 1.2 microns because of restriction in the KPR technique, changing $Q_B$ is not practical.

According to this invention, the difficulty is solved by increasing $Q_{FB}$ (i.e., $N_{FB}$) of the portion of oxide film in which the parasitic effect or the edge effect takes place. $Q_{FB}$ of the MOS element has been reduced in conventional devices by applying so-called phosphorus treatment in order to decrease $V_{T1}$ of each of the transistors $Q_1$ through $Q_6$. In this process, a glass layer has been formed on the whole surface of the wafer in a crucible at about 1,000° C.

Therefore, by removing the phosphorus glass layer corresponding to the portion other than where low threshold voltage $V_{T1}$ is necessary and in which the parasitic MOS effect or edge effect is produced, threshold voltage $V_{T2}$ is increased and no parasitic channel is formed, and thus erroneous operation can be prevented.

Figure 7:
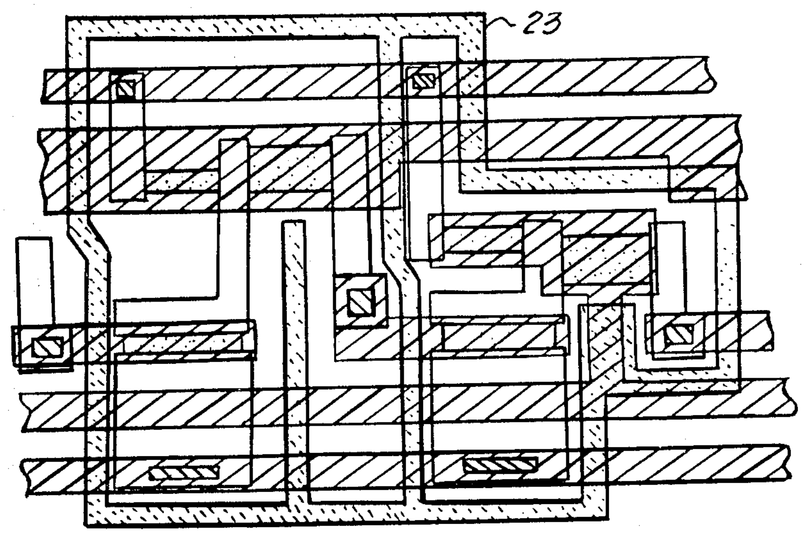
FIG. 7 is a plan view of a second embodiment of this invention improving the device of FIG. 6.

FIG. 7 shows an example of such removal of the phosphorus-glass layer. When the phosphorus-glass layer is removed at the portion 23 shown in the figure as an elongated area with dotted hatch lines, $Q_{FB}$ of the removed portion is increased and hence it is possible to remove the parasitic MOS effect and the edge effect. The width of the slit, or the portion to be removed is more than 7 microns. Below this width, punch through tends to occur. Besides, it is difficult to practically make the slit width below 7 microns from the viewpoint of mask accuracy.

Figure 8:
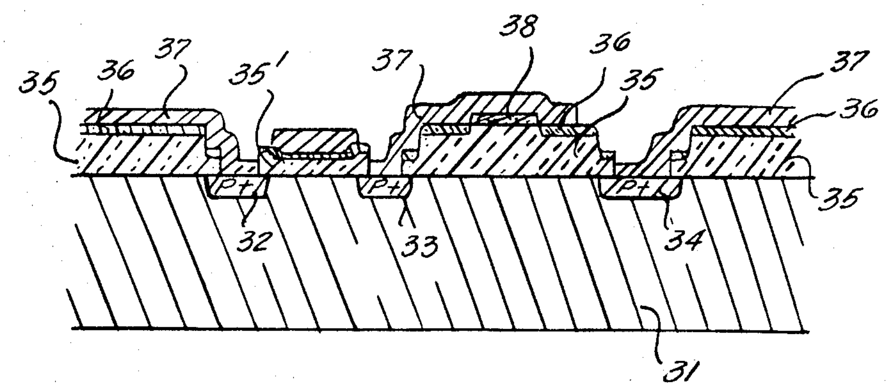
FIG. 8 is a sectional view showing another example of this invention.

FIG. 8 shows another embodiment for the purpose of increasing $Q_{FB}$, or $N_{FB}$, of the given portion, it is necessary that an insulation film which serves to increase $Q_{FB}$ be used for that portion. For example, a nitride film can be used for this insulation film. In a structure provided with nitride film, it is known that $Q_{FB}$ is several times greater than in the phosphorus-treated oxide film. Therefore, in this embodiment of the invention nitride film is employed which is attached only to the portion where enhancement of $Q_{FB}$ is required. Referring to FIG. 8, this is done in such manner that a silicon nitride film 38 is attached on the silicon oxide film 35 of the wafer 31 for which the source and drain regions 32 and 33 have been diffused, and a low temperature grown $SiO_2$ layer (not shown) is further attached on the nitride film, and the nitride film other than the required portion 38 is etched by using the low temperature grown $SiO_2$ as a mask. (Since KPR film cannot withstand the etching process of the nitride film; it is necessary to use the low temperature grown $SiO_2$ as a mask). After this process, the usual gate oxide film 35' is formed and the phosphorus treatment is performed. Because almost no phosphorus enters into the nitride film region 38, a phosphoric glass layer 36 is not formed there. Thereafter, a metallic layer 37 is applied. FIG. 8 shows a sectional view of a complete MOS integrated circuit produced according to the foregoing process, in which the parasitic MOS effect between the drain region 33 and another diffused region 34 independent of the drain region is prevented by presence of the silicon nitride film 38.

The above embodiments show cases where a specific circuit is integrated based on MOS structure. Needless to say, the invention is applicable to all bipolar semiconductor integrated circuits in which the MOS or the MIS parasitic element is produced between the elements. It is to be noted that the particular circuits realized by the integration technique have no direct relationship with the principle of this invention.

We claim:

1. A semiconductor integrated circuit device comprising a semiconductor substrate having a plurality of spaced diffuse circuit regions formed therein, a silicon oxide film selectively formed over said substrate and having windows therein in registration with selected ones of said diffused circuit regions, an insulation layer having a surface state density lower than that of said silicon oxide film formed over said silicon oxide film except at locations overlying a portion of said substrate between adjacent ones of said diffused regions, and a conducting layer formed on said insulation layer and extending through said windows to provide wiring connections to said diffused regions, whereby the formation of parasitic conduction channels between said adjacent diffused regions is effectively prevented.

2. The device of claim 1 in which said insulation layer comprises a phosphorus-treated layer between said conducting layer and said silicon dioxide film except at said locations.

3. The integrated circuit device of claim 2 further comprising a silicon nitride film formed on said silicon oxide film at locations thereof intermediate adjacent regions of said phosphorus-treated layer and overlying said substrate portion intermediate said adjacent diffused regions.